United States Patent
Song et al.

(10) Patent No.: US 6,417,042 B2
(45) Date of Patent: Jul. 9, 2002

(54) METHOD OF MANUFACTURING A CAPACITOR IN A SEMICONDUCTOR DEVICE

(75) Inventors: Han Sang Song, Seoul; Hyung Bok Choi, Sunghnam-Shi; Chan Lim, Ichun-Shi, all of (KR)

(73) Assignee: Hyundai Electronics Industries Co., Ltd., Kyungki-do (KR)

( * ) Notice: Subject to any disclaimer, the term of this patent is extended or adjusted under 35 U.S.C. 154(b) by 0 days.

(21) Appl. No.: 09/779,892

(22) Filed: Feb. 8, 2001

(30) Foreign Application Priority Data

Feb. 9, 2000 (KR) .............................. 00-05900

(51) Int. Cl.$^7$ ...................... H01G 7/06; H01L 21/8242
(52) U.S. Cl. .......................................... 438/240; 438/3
(58) Field of Search .................... 438/3, 238–240, 438/253–256, 381, 393–399

(56) References Cited

U.S. PATENT DOCUMENTS

| | | | | |
|---|---|---|---|---|
| 5,362,328 A | * | 11/1994 | Gardiner et al. | 118/726 |
| 5,985,714 A | * | 11/1999 | Sandhu et al. | 438/253 |
| 5,994,197 A | * | 11/1999 | Liao | 438/396 |
| 6,156,619 A | * | 12/2000 | Chen | 438/396 |
| 6,187,631 B1 | * | 2/2001 | Harshfield | 438/255 |

* cited by examiner

*Primary Examiner*—Jey Tsai
(74) *Attorney, Agent, or Firm*—Marshall, Gerstein & Borun.

(57) ABSTRACT

There is disclosed a method of manufacturing a capacitor in a semiconductor device. In a $Ta_2O_5$ capacitor using a Ru lower electrode, the method processes the Ru lower electrode at low temperature before a $Ta_2O_5$ film of a dielectric film is deposited, so that Ru crystal particles are filled with oxygen atoms to form a good quality $RuO_2$. Therefore, the disclosed method can prevent a lift phenomenon of a thin film by prohibiting a stress of the $Ta_2O_5$ dielectric film due to $RuO_2$ generated between the $Ta_2O_5$ dielectric film and the Ru lower electrode during the deposition process of a $Ta_2O_5$ dielectric and a subsequent annealing process. Also, the disclosed method can prevent diffusion of oxygen atoms and oxidization of a TiN film underlying the Ru film from the $Ta_2O_5$ dielectric film. As a result, the method can improve leakage current and electrical characteristics of a capacitor.

18 Claims, 1 Drawing Sheet

METHOD OF MANUFACTURING A CAPACITOR IN A SEMICONDUCTOR DEVICE

BACKGROUND OF THE INVENTION

1. Field of the Invention

The invention relates generally to a method of manufacturing a capacitor in a semiconductor device. More particularly, the invention relates to a method of manufacturing a capacitor in a semiconductor device using a metal material as a lower electrode.

2. Description of the Prior Art

Generally, as a semiconductor device is highly integrated, it is necessary that both the size of the device and the thickness (Tox) of an effective oxide film be reduced. Therefore, in order to manufacture a more reliable device, it is necessary that an electrical characteristic such as a leakage current be improved while change in the capacitance depending on a bias voltage is reduced. In order to improve this characteristic, a capacitor of a MIM (metal-insulator-metal) structure has been developed, in which a metal material is used as an upper electrode and a lower electrode is used instead of conventional polysilicon. When a metal electrode capacitor is formed, in order to manufacture reliable devices capable of preventing oxidization of a lower electrode material due to a thermal process after deposition of the entire film, and to improve characteristics such as the thickness of an effective oxide film and a leakage current in a capacitor, a method of depositing a good quality capacitor dielectric film and controlling thermal process conditions become very important factors.

When a capacitor including $Ta_2O_5$ in a memory device is manufactured, if noble metal materials such Ru, etc. are used as a lower electrode, as the energy barrier with polysilicon, that is, the work function is great, it is possible to reduce the thickness of an effective oxide film and to reduce a leakage current in the thickness of the same oxide film.

When a $Ta_2O_5$ dielectric film is deposited, however, a subsequent annealing process is required in order to secure a dielectric characteristic of a capacitor since oxygen content is low and the film includes impurities such as carbon and hydrogen. In an annealing process under oxygen atmosphere at high temperature in order to secure a dielectric characteristic of the $Ta_2O_5$, if the temperature of the annealing process is too high or the time of the annealing process is too long, the lower electrode is oxidized to create an unnecessary oxide at the interface the $Ta_2O_5$ film and the lower electrode.

In a structure in which TiN is used as a barrier film, Ru is used as a lower electrode and $Ta_2O_5$ is used a dielectric film, if an annealing process for securing a dielectric characteristic of a $Ta_2O_5$ film is performed, a $RuO_2$ film is formed at the interface of the Ru lower electrode and the $Ta_2O_5$ film. At this time, as the $RuO_2$ film is additionally formed, depending on the surrounding oxidizing condition, and not by a given oxidization condition applied to it, the quality of the film is degraded and the thickness of it becomes nonuniform. The $RuO_2$ film is grown while the surface of the Ru lower electrode is oxidized during the annealing process. Thus, not only a lifting phenomenon of the $Ta_2O_5$ film is generated by expanded volume due to growth of the $RuO_2$ film, but also oxygen contained in the $Ta_2O_5$ film is diffused into the Ru lower electrode. Due to this, there is a problem that a dielectric characteristic of the $Ta_2O_5$ film cannot be sufficiently obtained. Also, as the thickness of the $RuO_2$ film is nonuniform, the surface roughness at the interface of the Ru lower electrode and the $Ta_2O_5$ film is increased to lower the dielectric characteristic of the $Ta_2O_5$ film.

In addition, if oxygen is diffused into the TiN barrier film via the Ru lower electrode, the oxygen reacts with TiN to form a TiN barrier film made of TiO or TiON, which results in lowering of the quality of the TiN barrier film to degrade an electric characteristic of the device.

SUMMARY OF THE INVENTION

A method of manufacturing a capacitor in a semiconductor device according to the invention includes the sequential steps of forming a polysilicon film, a barrier film, and a Ru film on an oxide film formed on the semiconductor substrate, and then patterning the polysilicon, barrier, and Ru films to form a lower electrode; forming a $RuO_2$ film on the Ru film; forming a dielectric film on the $RuO_2$ film and then performing an annealing process; and forming an upper electrode on the dielectric film.

BRIEF DESCRIPTION OF THE DRAWINGS

The aforementioned aspects and other features of the disclosure will be explained in the following description, taken in conjunction with the accompanying drawing, wherein.

DETAILED DESCRIPTION OF PREFERRED EMBODIMENTS

The inventive method of manufacturing a capacitor in a semiconductor device can prevent diffusion of oxygen atoms and can improve a leakage current characteristic during a subsequent annealing process of a $Ta_2O_5$ film.

The disclosed method will be described in detail by way of a preferred embodiment with reference to accompanying drawing.

Figure 1A:
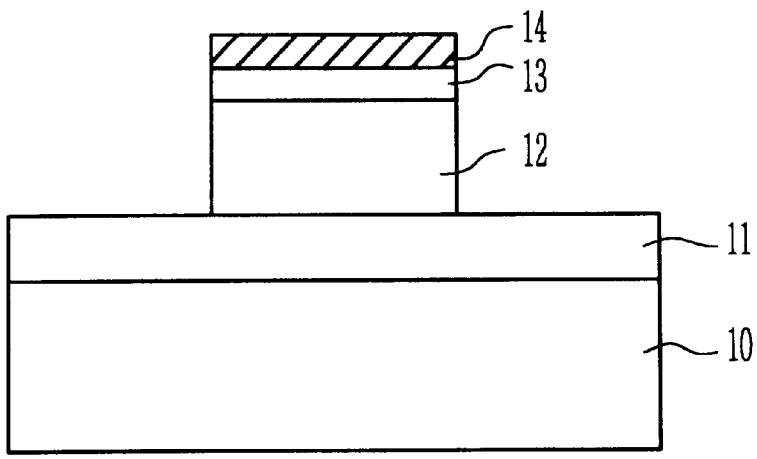
FIGS. 1A to 1C are cross-sectional views of a device for explaining a method of manufacturing a capacitor in a semiconductor device according to the disclosure.
Figure 1B:
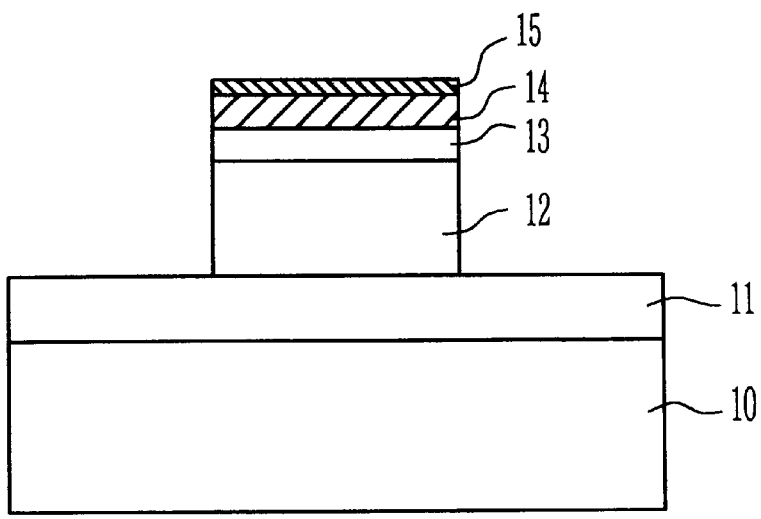
Figure 1C:
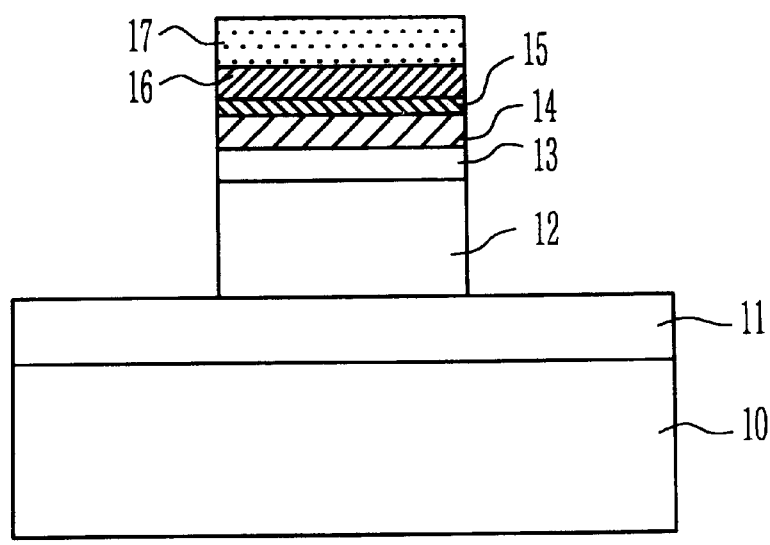

FIGS. 1A to 1C are cross-sectional views of a device for explaining a method of manufacturing a capacitor in a semiconductor device according to the disclosure.

Referring now to FIG. 1A, an oxide film 11 is formed on a semiconductor substrate 10. Then, after a doped polysilicon film 12, a barrier film 13 and a Ru film 14 are formed sequentially, the films 12, 13 and 14 are patterned until the oxide film 11 is exposed, thus forming a lower electrode.

In the above, the barrier film 13 is made of a TIN film and is deposited by a MOCVD method or a PVD method. The TIN film is deposited by a MOCVD method, using $Ti(N(CH_3)_2)_4$(TDMAT) as a raw material in a reaction furnace wherein the pressure is in the range of about 2 Torr to about 10 Torr, the temperature is in the range of about 300° C. to about 500° C., and He and Ar are used as a carrier gas. At this time, the flow the $Ti(N(CH_3)_2)_4$(TDMAT) raw material is in the range of about 200 sccm to about 500 sccm and the flow of the carrier gas, He and Ar, is in the range of about 100 sccm to about 300 scccm. After the TiN film of the barrier film 13 is deposited, it is cured by a plasma process with a power of about 500 W to about 1000 W for about 20 seconds to about 50 seconds.

The Ru film 14 may be formed by either a PVD method or a CVD method. The Ru film 14 formed using the PVD method is deposited in a thickness of about 500 Å to about 2000 Å in a reaction furnace under the atmosphere of Ar gas. At this time, Ru is deposited in the reaction furnace wherein Ar gas of about 50 sccm to about 200 sccm is used, the pressure is maintained in the range of about 2 mTorr to about 10 mTorr and the temperature is maintained in the range of about 250° C. to about 350° C. Also, the plasma power is kept in the range of about 500 W to about 2000 W.

Referring now to FIG. 1B, a $RuO_2$ film is formed on the Ru film 14, thus forming a lower electrode.

In the above, the $RuO_2$ film 15 is formed by performing a cleaning process using HF of 50:1 concentration for about 30 seconds to about 50 seconds, so that a native oxide film formed on the Ru film 14 can be removed, and then performing one of a rapid thermal process, a plasma process and a $UV/O_3$ process under a low-temperature oxygen atmosphere. The rapid thermal process under the low-temperature oxygen atmosphere, performs an oxidization process under $O_2$ or $N_2O$ gas atmosphere at the temperature of about 450° C. to about 550° C. for about 5 seconds to about 20 seconds. The plasma process is performed under $O_2$ or $N_2O$ gas atmosphere with the power of about 200 W to about 500 W at a temperature of about 300° C. to about 550° C. for about 30 seconds to about 120 seconds. The $UV/O_3$ process is performed with a density of 30 $mW/cm^2$ at a temperature of about 300° C. to about 550° C. for about 5 minutes to about 15 minutes.

Referring now to FIG. 1C, after a $Ta_2O_5$ film 16 and an upper electrode 17 are formed on the $RuO_2$ film 15, an annealing process is performed.

In the above, the $Ta_2O_5$ film 16 is deposited using $Ta(C_2H_5O_5)$ (tantalum ethoxide) an amount of about 0.005 cc to about 2 cc as a raw material, in a reaction furnace in which $N_2$ gas having a flow rate of about 350 sccm to about 450 sccm is used as a carrier gas of a reaction material and $O_2$ gas having flown rate of about 20 sccm to about 50 sccm is used as an oxidizer. At this time, a pressure of about 0.1 Torr to about 0.6 Torr and a temperature of about 300° C. to about 400° C. are maintained within the reaction furnace.

Instead of the $Ta_2O_5$ film 16 as the dielectric film, ferro dielectrics such as $(Ba_xSr_{1-x}) TiO_3$ (BST) or $(Pb_xZr_{1-x})) TiO_3$(PZT) may be used.

The annealing process employs either a rapid thermal process or a reaction furnace thermal process. The rapid thermal process is performed under s gas mixture atmosphere of $O_2$ and inert gases such as $N_2$, Ar and He at a temperature of about 500° C. to about 650° C. for about 30 seconds to about 60 seconds, and the reaction furnace thermal process is performed under a gas mixture atmosphere of $O_2$ and inert gases such as $N_2$, Ar and He at a temperature of about 500° C. to about 600° C. for about 10 seconds to about 30 seconds. In the rapid thermal process or the reaction furnace thermal process, the mixture ration of oxygen and the inert gas is in the range of about 1:10 to about 1:1.

The upper electrode 17 is made of a TiN film, a polysilicon film or a metal material such as Ru by chemical vapor deposition method. The TiN film is formed in a thickness of about 200 Å to about 500 Å by chemical vapor deposition method using $TiCl_4$ as a raw material and using $NH_3$ gas as a reaction gas at a temperature of about 300° C. to about 500° C. and a pressure of about 0.1 Torr to about 2 Torr. At this time, the amount of the raw material and the $NH_3$ gas are in the range of about 10 sccm to about 1000 sccm, respectively. The polysilicon film is formed in a thickness of about 800 Å to about 1200 Å.

As mentioned above, the disclosed method processes a Ru film of a lower electrode material at low temperature before a dielectric $Ta_2O_5$ film is deposited, so that Ru crystal particles are filled with oxygen atoms to form a good quality $RuO_2$. Therefore, the disclosed method has the advantage that it can prevent a lift phenomenon of a thin film by prohibiting a stress of a $Ta_2O_5$ dielectric film due to $RuO_2$ generated by a subsequent annealing process, and it can improve leakage current and electrical characteristics of a capacitor by preventing diffusion of oxygen atoms and oxidization of a TiN film underlying the Ru film from the $Ta_2O_5$ dielectric film.

The disclosed method has been described with reference to a particular embodiment in connection with a particular application. Those having ordinary skill in the art and access to the teachings of the present invention may recognize additional modifications and applications within the scope thereof.

It is therefore intended by the appended claims to cover any and all such applications, modifications, and embodiments within the scope of the invention.

What is claimed is:

1. A method of manufacturing a capacitor in a semiconductor device, comprising the steps of:

sequentially forming a polysilicon film, a barrier film, and a Ru film on an oxide film formed as a semiconductor substrate;

patterning the polysilicon, barrier and Ru films to form a lower electrode;

performing a cleaning process so that a native oxide film formed on the Ru film is removed;

performing an oxidization process so that a $RuO_2$ film is formed on the Ru film;

forming a $Ta_2O_5$ film on said $RuO_2$ film;

performing an annealing process; and forming an upper electrode on said $Ta_2O_5$ film.

2. The method of claim 1, wherein said barrier film comprises a TiN film formed by either a MOCVD method or a PVD method.

3. The method of claim 2, wherein said TiN film is formed by said MOCVD method using $Ti(N(CH_3)^2)_4$(TDMAT) as a raw material in a reaction furnace wherein a pressure is in the range of about 2 Torr to about 10 Torr, the temperature is in the range of about 300° C. to about 500° C., and He and Ar are used as a carrier gas.

4. The method of claim 1, wherein said Ru film is formed by either a PVD method or a CVD method.

5. The method of claim 4, wherein said Ru formed by said PVD method is formed in a thickness of about 500 Å to about 2000 Å in a reaction furnace under an Ar gas atmosphere at a flow rate of about 50 sccm to about 200 sccm, at a pressure of about 2 mTorr to about 10 mTorr and a temperature of about 250° C. to about 350° C. with a power of about 500 W to about 2000 W.

6. The method of claim 1, wherein said $RuO_2$ film is formed by performing a cleaning process using HF at a concentration of 50:1 for about 30 seconds to about 50 seconds, to remove a native oxide film on said Ru film, and then performing a process selected from the group consisting of rapid thermal processes, plasma processes and $UV/O_3$ processes under a low-temperature oxygen atmosphere.

7. The method of claim 1, wherein said $RuO_2$ film is formed by a rapid thermal process under $O_2$ or $N_2O$ gas atmosphere at a temperature of about 450° C. to about 550° C. for about 5 seconds to about 20 seconds.

8. The method of claim 1, wherein said $RuO_2$ film is formed by plasma process under $O_2$ or $N_2O$ gas atmosphere with a power of about 200 W to about 500 W at a temperature of about 300° C. to about 550° C. for about 30 seconds to about 120 seconds.

9. The method of claim 1, wherein said $RuO_2$ film is formed by a $UV/O_3$ process with a power density of 30 $mW/cm^2$ at a temperature of about 300° C. to about 550° C. for about 5 minutes to about 15 minutes.

10. The method of claim 1, wherein said dielectric film is one of a $Ta_2O_5$ film, a BST film, and a PZT film.

11. The method of claim 1, wherein said annealing process is a rapid thermal process which is performed under a mixed gas atmosphere of oxygen and inert gas at a temperature of about 500° C. to about 650° C. for about 30 seconds to about 60 seconds.

12. The method of claim 1, wherein said annealing process is a reaction furnace thermal process which is performed under a mixed gas atmosphere of oxygen and inert gas at a temperature of about 500° C. to about 600° C. for about 10 seconds to about 30 seconds.

13. The method of claim 12, wherein said mixture ratio of oxygen and inert gas is in the range of about 1:10 to about 1:1.

14. The method of claim 1, wherein said upper electrode comprises a TiN film, a polysilicon film and a metal material, and is found using chemical vapor deposition method.

15. A method of manufacturing a capacitor in a semiconductor device, comprising the steps of:
    sequentially forming a polysilicon film, a barrier film, and a Ru film on an oxide film as a semiconductor substrate;
    patterning the polysilicon, barrier, and Ru films to form a lower electrode;
    performing a cleaning process so that a native oxide film formed on the Ru film is removed;
    performing a rapid thermal process so that a $RuO_2$ film is formed on the Ru film;
    forming a $Ta_2O_5$ film on said $RuO_2$ film;
    performing an annealing process; and
    forming an upper electrode on said $Ta_2O_5$ film.

16. A method of manufacturing a capacitor in a semiconductor device, comprising the steps of:
    sequentially forming a polysilicon film, a barrier film, and a Ru film on an oxide film as a semiconductor substrate;
    patterning the polysilicon, barrier, and Ru films to form a lower electrode;
    performing a cleaning process so that a native oxide film formed on the Ru film is removed;
    performing a plasma process so that a $RuO_2$ film is formed on the Ru film;
    forming a $Ta_2O_5$ film on said $RuO_2$ film;
    performing an annealing process; and
    forming an upper electrode on said $Ta_2O_5$ film.

17. A method of manufacturing a capacitor in a semiconductor device, comprising the steps of:
    sequentially forming a polysilicon film, a barrier film, and a Ru film on an oxide film as a semiconductor substrate;
    patterning the polysilicon, barrier, and Ru films to form a lower electrode;
    performing a cleaning process so that a native oxide film formed on the Ru film is removed;
    performing a UV/O3 process so that $RuO_2$ film is formed on the Ru film;
    forming a $Ta_2O_5$ film on said $RuO_2$ film;
    performing an annealing process; and
    forming an upper electrode on said $Ta_2O_5$ film.

18. A method of manufacturing a capacitor in a semiconductor device, comprising:
    sequentially forming a polysilicon film, a barrier film, and a Ru film on an oxide film formed as a semiconductor substrate;
    patterning the polysilicon, barrier and Ru films to form a lower electrode;
    performing a cleaning process on the Ru film so that a native oxide film formed on the Ru film is removed and;
    performing an oxidization process so that a $RuO_2$ film is formed on the Ru film;
    forming a $Ta_2O_5$ film on said $RuO_2$ film;
    performing an annealing process; and
    forming an upper electrode on said $Ta_2O_5$ film.

* * * * *